United States Patent [19]
Eda et al.

[11] Patent Number: 4,746,626
[45] Date of Patent: May 24, 1988

[54] METHOD OF MANUFACTURING HETEROJUNCTION BIPOLAR TRANSISTORS

[75] Inventors: Kazuo Eda, Hirakata; Masanori Inada, Nara; Yorito Ota, Kobe, all of Japan

[73] Assignee: Matsushita Electric Industrial Co., Ltd., Osaka, Japan

[21] Appl. No.: 48,470

[22] Filed: May 8, 1987

Related U.S. Application Data

[63] Continuation-in-part of Ser. No. 875,878, Jun. 18, 1986, abandoned.

[30] Foreign Application Priority Data

Jun. 21, 1985 [JP] Japan ............................ 60-136402
Jun. 21, 1985 [JP] Japan ............................ 60-136405
Jun. 21, 1985 [JP] Japan ............................ 60-136409
Jun. 24, 1985 [JP] Japan ............................ 60-137261

[51] Int. Cl.$^4$ ............................................ H01L 21/203
[52] U.S. Cl. ................................. 437/107; 437/133; 437/909
[58] Field of Search ..................... 437/107, 133, 909

[56] References Cited

U.S. PATENT DOCUMENTS

| | | | |
|---|---|---|---|
| 2,569,347 | 9/1951 | Shockley | 148/1.5 |
| 3,413,533 | 11/1968 | Kroemer et al. | 357/16 |
| 3,780,359 | 12/1973 | Dumke et al. | 148/175 X |
| 4,561,916 | 7/1984 | Akiyama et al. | 148/175 |
| 4,567,060 | 1/1986 | Hayakawa et al. | 148/175 X |
| 4,575,924 | 3/1986 | Reed et al. | 29/576 E |
| 4,593,457 | 6/1986 | Birrittella | 148/175 X |
| 4,617,724 | 10/1986 | Yokoyama et al. | 148/175 |

FOREIGN PATENT DOCUMENTS 3829 1/1980 Japan .

OTHER PUBLICATIONS

Heterostructure Bipolar Transistors and Integrated Circuits, H. Kroemer, Proceedings of the IEEE, vol. 70, No. 1, pp. 13–25, Jan. 1982.

*Primary Examiner*—George T. Ozaki
*Attorney, Agent, or Firm*—Wenderoth, Lind & Ponack

[57] ABSTRACT

A heterojunction bipolar transistor having excellent high-frequency characteristics is manufactured by forming a semi-insulating semiconductor layer on a collector (or emitter) layer, removing a part of the semi-insulating semiconductor layer to form a cut portion so that the collector layer is exposed at the cut portion, growing a base layer on the semi-insulating semiconductor layer, on a slant wall of the cut portion and on the exposed part of the collector layer, and growing an emitter (or collector) layer on the base layer. A base layer may be preliminarily formed on the semi-insulating semiconductor layer before forming the cut portion. Energy band gap of the emitter is greater than that of the base.

12 Claims, 3 Drawing Sheets

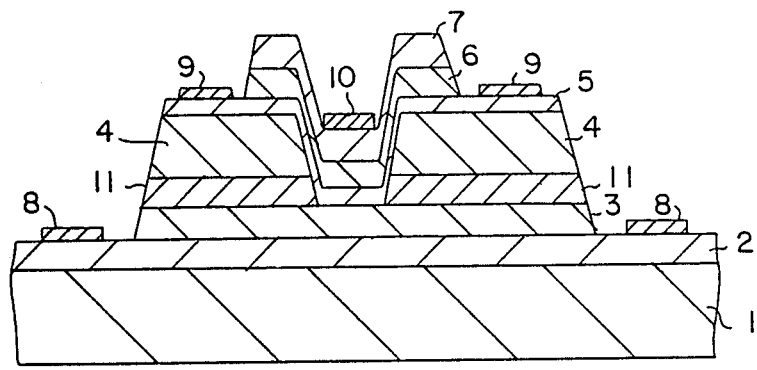
FIG. I(a)
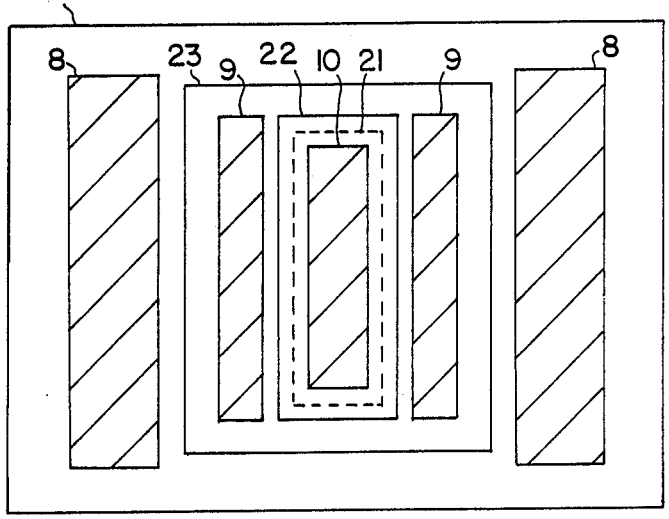
FIG. I(b)
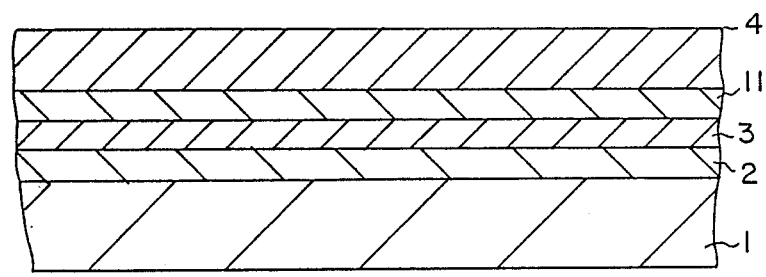
FIG. 2

METHOD OF MANUFACTURING HETEROJUNCTION BIPOLAR TRANSISTORS

This application is a continuation-in-part of application Ser. No. 875,878, filed June 18, 1986, now abandoned.

BACKGROUND OF THE INVENTION

1. Field of the Invention

The present invention relates to a heterojunction bipolar transistor and a method of manufacturing the transistor.

2. Description of the Prior Arts

Typically, any conventional npn-type bipolar transistor is provided with an n+-type collector which is formed on an n-type silicon substrate by means of epitaxial growth, a p-type base formed on the n+ collector by means of diffusion, and an n-type emitter formed on the p-type base either by means of diffusion or by applying alloy.

Likewise, any conventional pnp-type bipolar transistor can also be formed in the manner similar to the above.

Each of these bipolar transistors incorporates emitter, base, and collector, which are commonly made of a single semiconductive material, i.e., silicon.

Operation speed of a transistor, which relates to the high-frequency characteristics, depends on the time constants for charging/discharging of emitter-base and base-collector junction capacitances and on the transit time of electrons between emitter and collector.

Maximum oscillation frequency Fmax of a bipolar transistor is expressed as:

$$Fmax = \sqrt{Ft/(8\pi RbCc)} \tag{1}$$

where
- Ft: cutoff frequency
- Rb: base resistance
- Cc: collector capacitance

Accordingly, when at least one of the collector capacitance and the base resistance is made smaller, the high-frequency characteristics become better. Cutoff frequency Ft has a specific relationship with the transit time of electrons between emitter and collector, which is expressed as:

$$Ft = \tfrac{1}{2}\pi\tau \tag{2}$$

$$= \tau e + \tau b + \tau c + \tau cc \tag{3}$$

$\tau e$ (transit time of electrons through depletion layer of emitter) =

$$re (Cc + Ce + Cp)$$

$\tau b$ (transit time of electrons through base)

$\tau c$ (transit time of electrons through collector)

$\tau cc$ (time needed for charging depletion layer of collector) =

$$(Re + Rc)(Cc + Cp)$$

where
- Ce: emitter capacitance
- Cp: parasitic capacitance
- re: emitter differential resistance
- Re: emitter resistance
- Rc: collector resistance Consequently, when the emitter capacitance is made smaller, the time needed for electrons to pass through emitter becomes shorter, thus resulting in improved high-frequency characteristics. As a matter of course, when the base width is made narrower the time needed for electrons to pass through the base becomes shorter, thus also resulting in improved high-frequency characteristics. Nevertheless, any of the conventional arts still fails to securely produce such a transistor having less junction capacitance and short base-width in addition to satisfactory ohmic contact by the simple structure based on the simplified manufacturing method as described above. Therefore, it is not possible for the conventional arts to produce transistors featuring satisfactory high-frequency characteristics.

Incidentally, it is known that satisfactory high-frequency characteristics can be securely obtained by a heterojunction bipolar transistor, in which the emitter is formed with a specific semiconductor having an energy band gap greater than that of the base to lower the base resistance. Typical heterojunction bipolar transistors are disclosed in U.S. Pat. No. 2,569,347, U.S. Pat. No. 3,413,533, U.S. Pat. No. 3,780,359, and an article entitled "Heterostructure Bipolar Transistors and Integrated Circuits" written by Herbert Kroemer, Proceedings of The IEEE, Vol. 70, No. 1, Pages 13 through 25, issued in 1982.

The essence of these prior arts is to make up the band of the emitter-base junction by applying a properly selected material so that the band does not substantially act as a barrier to electrons but acts as a large barrier to holes which move from the base to the emitter. As a result, carrier density (hole density) of the base can be significantly increased. This effectively reduces the base resistance, thus realizing an extremely high maximum oscillation frequency Fmax. Typical one of this type of transistors incorporates emitter made of $Al_xGa_{1-x}As$ (x>0), and base and collector which are respectively made of GaAs.

However, the junction capacitance still remains large by merely lowering the base resistance. Further, if the base width is narrowed, the electrode cannot easily be drawn out and eventually the external base resistance will increase. Consequently, these heterojunction bipolar transistors cannot satisfactorily improve the high-frequency characteristics.

Japanese Patent Publication No. 55-3829 discloses an improved method for extracting base electrode. In this method, n-type collector layer, p-type base layer and n-type emitter layer are respectively formed on a GaAs substrate by applying liquid-phase epitaxial method. Next, a part of the n-type collector layer is exposed by mesa etching, and then a p-type $Al_xGa_{1-x}As$ (x>0) layer is formed on the exposed part by liquid-phase epitaxial method for extracting base electrode. Thereafter, a collector electrode on the collector layer, a base electrode on the p-type $Al_xGa_{1-x}As$ layer, and an emitter electrode on the emitter layer are formed.

However, the method proposed by this prior art still has some problems. Concretely, a parastic junction capacitance produced between the emitter and the later-formed base-electrode-extraction p-type $Al_xGa_{1-x}As$ layer will cause an increase of the junction capacitance between the emitter and base, and yet, no improvement is done for the junction capacitance between the base and collector. If the emitter were formed before forming the collector on the emitter, the junction capacitance between the base and collector would be reduced, but the junction capacitance between the base and emitter will increase, thus badly affecting the high frequency characteristics.

As is clear from the foregoing explanation, it is quite difficult for any conventional art to securely produce transistors featuring small junction capacitance, narrow base width, and small external base resistance. Consequently, the transistors produced by the conventional arts cannot have fully satisfactory high-frequency characteristics.

SUMMARY OF THE INVENTION

In the light of the disadvantages inherent to the transistors manufactured by the prior arts as described above, an object of the present invention is to provide a novel structure of a heterojunction bipolar transistor and a related manufacturing method, featuring small junction capacitance, narrow base width, small external base resistance, and easy base electrode extraction.

To securely achieve the above object, the present invention provides a novel method of manufacturing a heterojunction bipolar transistor comprising the steps of: preliminarily forming a thick base electrode extraction layer isolated from a collector (or an emitter) by a semi-insulating semiconductor layer; removing a part of the base electrode extraction layer and a part of the semi-insulating semiconductor layer by etching; growing an extremely thin base layer on the removed parts of the layers by an epitaxial regrowth technique such as molecular beam epitaxy; and finally regrowing an emitter (or collector) layer on the thin base layer. Implementation of this method securely realizes a novel structure of heterojunction bipolar transistor featuring easiness of base electrode extraction, low external base resistance, extremely narrow base width, and small collector and emitter capacitances.

The present invention will be better understood from the detailed description given hereinbelow in connection with the accompanying drawings in which:

BRIEF DESCRIPTION OF THE DRAWINGS

FIG. 1(a) is a sectional diagram of a heterojunction bipolar transistor reflecting a preferred embodiment of the present invention;

FIG. 1(b) is a plan view of the heterojunction bipolar transistor of FIG. 1(a);

FIGS. 2 through 4 are sectional diagrams showing structures in respective steps for manufacturing the heterojunction bipolar transistor in FIG. 1.

Figure 3:
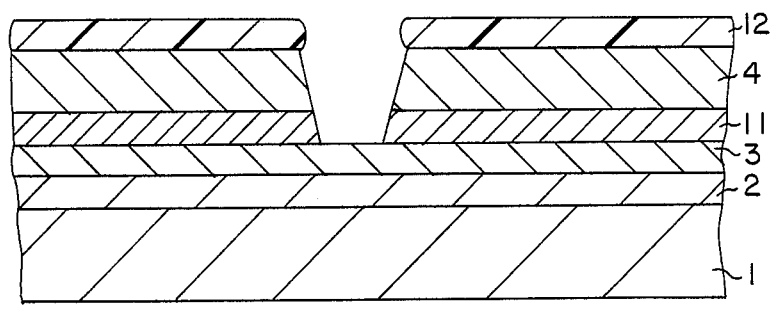

DESCRIPTION OF THE PREFERRED EMBODIMENTS (First Preferred Embodiment)

FIG. 1(a) is a sectional diagram of a heterojunction bipolar transistor as a first preferred embodiment of the present invention, and FIG. 1(b) is a plan view of the same. Referring to FIG. 1, the heterojunction bipolar transistor comprises a semi-insulating GaAs substrate 1, a first collector layer (which is substantially an electrode extraction layer) 2 of n+-type GaAs, a second collector layer 3 of n-type GaAs, a first base layer (which is substantially an electrode extraction layer 4 of p-type GaAs, a second base layer 5 of p-type GaAs, a first emitter layer 6 of n-type $Al_xGa_{1-x}As$ (where x=0.3), a second emitter layer (which is substantially an electrode extraction layer) 7 of n+-type GaAs, collector electrodes 8, base electrodes 9, an emitter electrode 10, and a semi-insulating GaAs semiconductor layer 11.

In this structure, the second collector layer 3, the second base layer 5 and the first emitter layer 6 correspond to the so-called "collector", "base" and "emitter", respectively, of the transistor. Energy band gap of GaAs is 1.42 eV, and energy band gap of $Al_xGa_{1-x}As$ (x>0) is larger (e.g. 1.80 eV when x=0.3) than that of GaAs. Therefore, in the above structure the energy band gap of the first emitter layer (emitter) 6 is larger than that of the second base layer (base) 5. This relationship is always satisfied under the condition of x>0. Accordingly, as described before, carrier concentration of the base can be higher than that of the emitter, resulting in reduction of the base resistance. In this embodiment, carrier concentration of the emitter is $5 \times 10^{17}/cm^3$, and that of the base is $1 \times 10^{19}/cm^3$.

Thickness and carrier concentration of each layer are as follows:

Semi-insulating GaAs substrate 1: 400 μm, less than $10^{14}/cm^3$ n+-type GaAs first collector layer 2: 4000 Å, $5 \times 10^{18}/cm^3$ n-type GaAs second collector layer 3: 2000 Å, $5 \times 10^{16}/cm^3$ p-type GaAs first base layer 4: 4000 Å, $1 \times 10^{19}/cm^3$ p-type GaAs second base layer 5: 400 Å, $1 \times 10^{19}/cm^3$ n-type $Al_xGa_{1-x}As$ first emitter layer 6: 1500 Å, $5 \times 10^{17}/cm^3$ n+-type GaAs second emitter layer 7: 1500 Å, $5 \times 10^{18}/cm^3$ Semi-insulating GaAs semiconductor layer 11: 5000 Å, less than $10^{15}/cm^3$ Note: Layers 2 through 7 and 11 are respectively formed by means of molecular beam epitaxy (MBE) at 600° C. Si and Be are used as n-type and p-type dopants, respectively.

Next, a method of manufacturing the FIG. 1 embodiment will be described. As shown in FIG. 2, layers 2, 3, 11 and 4 are formed to be the predetermined thicknesses on the semi-insulating GaAs substrate 1 using molecular beam epitaxy. Next, a resist mask 12 is formed on the layer 4 by conventional photolithography, and then, using the resist mask 12, as shown in FIG. 3, a part of the second collector layer 3 is exposed by partially etching the first base layer 4 of p-type GaAs and the semi-insulating GaAs semiconductor layer 11. This portion will hereafter be referred to as "cut portion". At this time, the second collector layer 3 may be partly etched as shown by a broken line in FIG. 3. The etching of the GaAs layers can be done by using a solution containing a mixture of $H_2SO_4$—$H_2O_2$—$H_2O$. By using a substrate having surface orientation (001) as the GaAs layers, the tilt angle of the etched slant wall surfaces of the layers 4 and 11 can be made smaller than 90°, more specifically nearly 45° as seen from the crystallographic orientation <110> as shown in FIG. 3.

Figure 4:
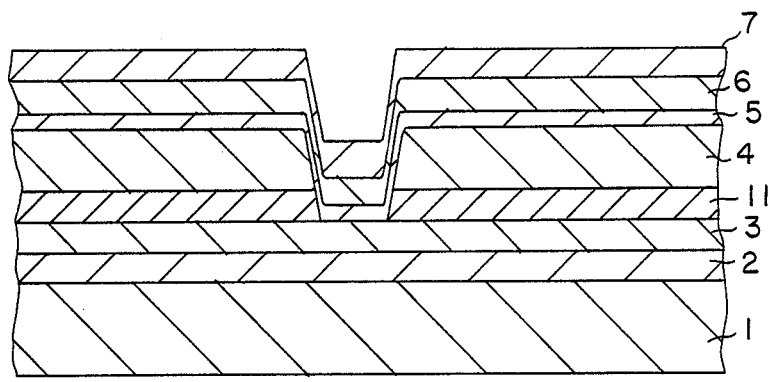

Next, the resist 12 is removed with acetone, and then the second base layer 5 of 400 Å p-type GaAs, the first emitter layer 6 of 1500 Å n-type $Al_xGa_{1-x}As$ and the second emitter layer 7 of 1500 Å n+-type GaAs are grown in turn by molecular beam epitaxy as shown in FIG. 4.

The second base layer 5 is formed on the exposed part of the second collector layer 3, the slant surfaces of the semi-insulating semiconductor layer 11 and the first base layer 4, and the upper surface of the first base layer 4. The part of the second base layer 5 formed on the exposed part of the collector layer 3 functions as a base region, whereas the part of the second base layer 5 formed on the upper surface of the first base layer 4 functions as a first external base layer region where the base electrode 9 will be formed. The part of the second base layer 5 formed on the slant surfaces of the semi-insulating semiconductor layer 11 and the first base layer 4 functions as a second external base region for electrically connecting the first external base region and the part functioning as the base region. Since the tilt angle is nearly 45°, the electrical connection can be secured satisfactorily. A variety of tilt angles can be obtained by properly selecting the crystal orientation and the wet-etching solution. However, it is quite necessary to grow the second base layer 5 on the slant surfaces without causing a disconnection between the part formed on the exposed collector 3 and the first base layer 4. To securely realize this, at least a part of the slant surfaces should be tilted less than 90°. This can be realized by properly combining the crystal orientation and the wet-etching solution.

Next, a photoresist is coated on the whole top surface. Then a mask of the photoresist is formed on the cut portion using an ordinary photolithography technique to form an emitter mesa 22. Using a solution of a mixture of $H_2SO_4$—$H_2O_2$—$H_2O$, the second base layer 5 is exposed by etching. The part covered by the mask becomes the emitter mesa.

After removing the photoresist by acetone, a photoresist is coated on the whole top surface. Then a mask of the photoresist which covers the emitter mesa and a portion of the exposed second base layer is formed using the ordinary photolithograph technique to form a base mesa 23. Using the solution of the mixture of $H_2SO_4$—$H_2O_2$—$H_2O$, the first collector layer 2 is exposed by etching. The part covered by the mask becomes the base mesa.

After removing the photoresist by acetone, a photoresist is coated on the whole top surface. Then a mask of the photoresist which covers the emitter mesa, the base mesa and a portion of the exposed first collector layer is formed using the ordinary photolithography technique to form a collector mesa 24. Using the solution of the mixture of $H_2SO_4$—$H_2O_2$—$H_2O$, the semi-insulating semiconductor layer 11 is exposed by etching. The part covered by the mask becomes the collector mesa.

After removing the photoresist by acetone, a photoresist is coated on the whole top surface. Then windows are formed in the photoresist on the emitter mesa and the first collector layer exposed at the collector mesa using the ordinary photolithography technique. Then, an alloy of AuGe is evaporated on that. The photoresist is then removed by acetone. At the same time the alloy on the photoresist is also removed and the alloy in the window on the emitter mesa and in the windows on the exposed first collector layer are left for the emitter electrode 10 and the collector electrodes 8, respectively. This method is known as a lift-off method. Then the sample is heat-treated at 330° C. for 20 seconds in nitrogen.

A photoresist is then coated on the whole top surface. Then windows are formed in the photoresist on a second base layer exposed at the base mesa using a conventional photolithography technique. Then an alloy of AuZn is evaporated on that. The photoresist is then removed by acetone. At the same time the alloy on the photoresist is also removed and the alloy in the windows in the exposed second base layer are left for the base electrodes 9. The sample is then heat-treated at 220° C. for 20 seconds in nitrogen. In this way, the final structure shown in FIG. 1(a) is obtained.

The typical dimensions of the transistors are as follows:

emitter electrode 10: $2\times 8$ $\mu m^2$ rectangular
"cut portion" 21: $3\times 9$ $\mu m^2$ rectangular
emitter mesa 22: $4\times 10$ $\mu m^2$ rectangular
base electrode 9: $1.5\times 10$ $\mu m^2$ rectangular
base mesa 23: $11\times 11$ $\mu m^2$ rectangular
collector electrode 8: $3\times 13$ $\mu m^2$ rectangular
collector mesa 24: $22\times 16$ $\mu m^2$ rectangular According to the structure of the heterojunction bipolar transistor embodied by the present invention, collector capacitance Cc is the sum of the junction capacitance of the pn junction part between the layers 3 and 5 and the junction capacitance of the junction part between the layers 11 and 3.

Generally, capacitance Cpn of the pn junction is expressed as follows:

$$Cpn = A \cdot \sqrt{\frac{q \cdot N_{A1} \cdot N_{D2} \cdot \epsilon_1 \cdot \epsilon_2}{2(\epsilon_1 N_{A1} + \epsilon_2 N_{D2}) Vb}} \quad (4)$$

where
A: area of the junction part
q: charge
$N_{A1}$: acceptor concentration of p-type semiconductor
$N_{D2}$: donor concentration of n-type semiconductor
$\epsilon_1$: dielectric constant of p-type semiconductor
$\epsilon_2$: dielectric constant of n-type semiconductor, and
Vb: bias voltage Accordingly, it is understood that, when a significant difference is present between the concentrations of acceptor and donor, the junction capacitance Cpn can be determined approximately by smaller one of the concentrations. In the first preferred embodiment of the present invention, the acceptor concentration of the p-type GaAs base layers are $1 \cdot 10^{19}/cm^3$ and the donor concentration of the n-type GaAs collector layer is $5 \cdot 10^{16}/cm^3$. Accordingly, the junction capacitance is approximately expressed as follows:

$$Cpn \propto \sqrt{N_{D2}} \quad (5)$$

On the other hand, since the acceptor concentration of the semi-insulating GaAs layer is at most $1 \cdot 10^{15}/cm^3$, the junction capacitance between the n+-type GaAs layer and the semi-insulating GaAs layer is proportional to the square root of this acceptor concentration, and thus the value of this junction capacitance is significantly smaller than that given by the formula (5). The ratio of these junction capacitances approximately corresponds to the ratio of the thickness of the depletion layer formed on the collector and the thickness of the semi-insulating semiconductor layer. In the present embodiment, since the thickness of the collector depletion layer is about 2500 Å and the thickness of the semi-insulating semiconductor layer is 5000 Å, the collector capacitance at the portion where the semi-insulating semiconductor layer exists is reduced to one-half the case in which no semi-insulating semiconductor layer exists.

Even when using a p-type $Al_yGa_{1-y}As$ layer instead of the p-type GaAs first base layer, the junction capacitance, which is determined by the lower carrier concentration, remains almost unchanged. Due to those reasons mentioned above, by forming the semi-insulating semiconductor layer between the p-type GaAs layer for extracting the base electrode and the n-type GaAs collector layer as in the present embodiment, the collector capacitance can be significantly reduced.

Emitter capacitance Ce in the present embodiment is proportional to the junction area of the re-grown emitter and the base. Since this junction area is identical to the mesa-etching area of the emitter, it can be determined by the dimensions of the photolithography mask, and can be set at the minimum dimensions of the mask. Since the emitter portion is processed by mesa etching, the structure of the present embodiment has a small parastic capacitance. Further, since energy band gap of the emitter is larger than that of the base, carrier concentration of the base can be made higher, and therefore the base resistance can be reduced.

Further, the width of the base region of the present embodiment is extremely short, i.e., 400 Å. The base transit time $\tau b$ needed for electrons to pass through the base of a bipolar transistor is expressed as follows:

$$\tau b = Lb/Ve \qquad (6)$$

where
Lb: base width
Ve: velocity of electrons passing through the base
Consequently, the high-frequency characteristics based on the base transit time of electrons can be improved drastically.

In addition, since the base electrode extraction part, whose thickness is a sum of those of the first base layer 4 and the second base layer (the base) 5, is thicker than that of the second base layer (the base) 5, the base resistance at this part, i.e. the external base resistance, can be extremely reduced. In other words, since the base is thinner than the first external base layer, the external base resistance can be reduced with maintaining the short base transit time. This also contributes to the improvement of the high-frequency characteristics.

As was initially expected, the heterojunction bipolar transistor of the present embodiment showed a variety of advantageous features. First, the introduction of the semi-insulating semiconductor layer resulted in sharp reduction of the collector capacitance by about 43%. In addition, since the parasitic capacitance is negligible and minimum dimensions of mask can be applied, the emitter capacitance was reduced. Furthermore, an ideal ohmic electrode could be formed on the extremely thin (400 Å) base. Consequently, the base transit time was reduced by 70% compared with the conventional one with 1500 Å base width. Also, the external base resistance was reduced by 30%. As a result, when employing the same minimum dimensions, the heterojunction bipolar transistor of the present embodiment proved to have sharply improved high-frequency characteristics compared to any conventional heterojunction bipolar transistors, indicating sharp improvement of cutoff frequency Ft by about 25% and maximum oscillation frequency Fmax by about 56%.

The first preferred embodiment has 400 Å base width for example. However, a still thinner base can be realized by applying molecular beam epitaxy. Furthermore, an extremely thin base can be produced also by applying metalorganic chemical vapor-phase epitaxy (MOCVD) for example.

In addition, the first preferred embodiment employ GaAs-Al$_x$Ga$_{1-x}$As (x>0), which is one of the group III-V compound semiconductors as the semiconductor. However, it is also possible to employ other group III-V compound semiconductor materials such, for example, as InP-InGaAs. When using InP-InGaAs, a heterojunction bipolar transistor with an emitter having a larger energy band gap than that of a base can be produced by using InP as the emitter material and In$_{0.53}$Ga$_{0.47}$As as the base material.

In the first preferred embodiment, x=0.3 as Al concentration is used, but, Al concentration can be chosen freely in the range of x>0, in which energy band gap of Al$_x$Ga$_{1-x}$As is larger than that of GaAs.

Likewise, in the first preferred embodiment, GaAs is used for the semi-insulating semiconductor layer. It is suggested that, if Al$_y$Ga$_{1-y}$As (y>0), which has less dielectric constant than that of GaAs is used, the collector capacitance can be reduced more, thus eventually further improving the high-frequency characteristics. Dielectric constant of GaAs is 13.1, while that of AlAs (y=1) is 10.1, for example. If y=0 in Al$_y$Ga$_{1-y}$As, it apparently is GaAs used in the first emboodiment. Therefore, the material usable for the semi-insulating semiconductor layer can be generally expressed as Al$_y$Ga$_{1-y}$As (y≧0).

Also, the first preferred embodiment has n-type emitter and collector, and p-type base. It is also possible to replace the emitter and collector by the p-type and the base by the n-type.

(Second preferred embodiment)

Figure 5:
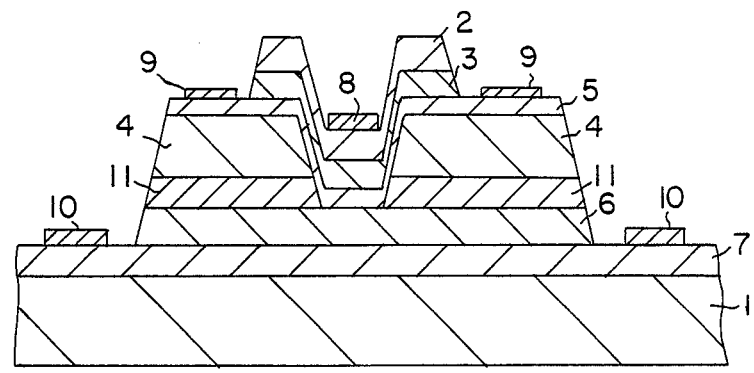
FIGS. 5 and 6 are respectively sectional diagrams of heterojunction bipolar transistors reflecting other preferred embodiments of the present invention.

The first preferred embodiment has a structure in which the collector was formed before forming the emitter above it. This relationship can be reversed by first forming the emitter before forming the collector above it. Such a structure is shown in FIG. 5. Only the positions of the emitter and the collector are reversed.

Therefore, the manufacturing method of the second preferred embodiment can be described by merely changing the terms "emitter" and "collector" to "collector" and emitter", respectively in the description of the first preferred embodiments.

Figure 6:
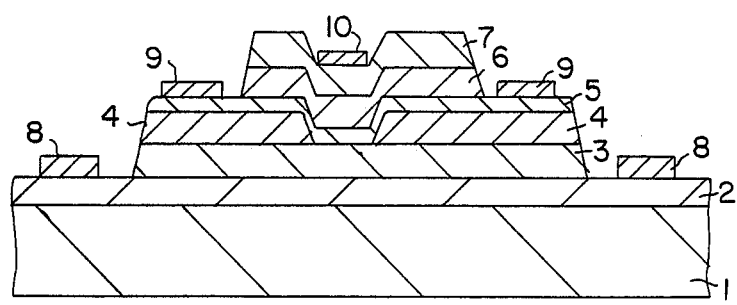

Thus, the structure in FIG. 6 is fabricated by the steps of: forming a first emitter layer which is substantially an electrode extraction layer on a semi-insulating semiconductor substrate: forming a second emitter layer on the first emitter layer; forming a semi-insulating semiconductor layer on the second emitter layer; forming a first base layer on the semi-insulating semiconductor layer; removing at least a part of the first layer and semi-insulating semiconductor layer to form a cut portion with a slant wall so that the second emitter layer is partly exposed to the cut portion; epitaxially growing a second base layer on the semi-insulating semiconductor layer to be a first external base region, on the slant wall to be a second external base region, and on the exposed portion of the second emitter layer to be a base region; epitaxially growing a first collector layer on the second base layer; epitaxially growing a second collector layer which is substantially an electrode extraction layer on the first collector layer; and forming a collector electrode, at least one base electrode and at least one emitter electrode on the second collector layer at a portion in the cut portion, the first external base region and the first emitter layer, respectively. The energy band gap of the second emitter layer is greater than the energy band gap of the second base layer. The materials and the process conditions are exactly identical to those used for the first preferred embodiment. The same description can be applied to this second embodiment by merely exchanging the emitter capacitance with the collector capacitance in the foregoing description. In other words, in the second preferred embodiment the emitter capacitance can be sharply decreased by the presence of the semi-insulating semiconductoor layer, and the collector capacitance is determined by the minimum dimensions of the mask, and yet, reducing the parasitic capacitance. The second preferred embodiment introduces the exactly same effects as to the base resistance and the extraction of the base electrode as those in the first preferred embodiment. As a result, the second preferred embodiment proved to have achieved significant improvement of the high-frequency characteristics almost identical to the first preferred embodiment.

(Third preferred embodiment)

The first preferred embodiment provides a method which forms the first base layer preliminarily on the semi-insulating semiconductor layer. However, even if this layer is absent, the third preferred embodiment provides the identical effect of improved junction capacitance. The structure of the third preferred embodiment shown in FIG. 6 can be produced by applying the same method as the first preferred embodiment except that the first base layer is not formed. Compared with any of the conventional heterojunction bipolar transistors available today, the third embodiment also sharply decreases the junction capacitance, so that it also proved to have significantly improved high-frequency characteristics.

What is claimed is:

1. A method of manufacturing a III-V compound heterojunction bipolar transistor comprising the steps of:
    forming a first collector layer which is substantially an electrode extraction layer on a semi-insulating semiconductor substrate;
    forming a second collector layer on said first collector layer;
    forming a semi-insulating semiconductor layer on said second collector layer;
    forming a first base layer on said semi-insulating layer;
    removing at least a part of said first base layer and said semi-insulating semiconductor layer to form a cut portion with slant wall so that said second collector layer is partly exposed to said cut portion;
    epitaxially growing a second base layer on said first base layer to be a first external base region, on a said slant wall to be a second external base region, and on the exposed portion of second collector layer to be a base region;
    epitaxially growing a first emitter layer on said second base layer, wherein the energy band gap of said first emitter layer is greater than the energy band gap of said second base layer so that a heterojunction is formed by said first emitter layer and said second base layer;
    epitaxially growing a second emitter layer which is substantially an electrode extraction layer o said first emitter; and
    forming an emitter electrode, at least one base electrode and at least one collector electrode on said second emitter layer at a portion in said cut portion, said first external base region and said first collector layer, respectively.

2. The method according to claim 1, wherein $Al_xGa_{1-x}As$ (x>0), GaAs and $Al_yGa_{1-y}As$ (y≧0) are used for said first emitter layer, said second base layer and said semi-insulating layer, respectively, wherein said cut portion is formed by wet etching.

3. The method according to claim 1, wherein said second base layer, said first emitter layer and said second emitter layer are grown by molecular beam epitaxy.

4. A method of manufacturing a III-V compound heterojunction bipolar transistor comprising the steps of:
    forming a first emitter layer which is substantially an electrode extraction layer on a semi-insulating semiconductor substrate;
    forming a second emitter layer on said first emitter layer;
    forming a semi-insulating semiconductor layer on said second emitter layer;
    forming a first base layer on said semi-insulating semiconductor layer;
    removing at least a part of said first base layer and said semi-insulating semiconductor layer to form a cut portion with a slant wall so that said second emitter layer is partly exposed to said cut portion;
    epitaxially growing a second base layer in said semi-insulating semiconductor layer to be a first external base region, on said slant wall to be a second external base region, and on the exposed portion of said second emitter layer to be a base region, wherein the energy band gap of said second emitter layer is greater than the energy band gap of said second base layer so that a heterojunction is formed by said second emitter layer and said second base layer;
    epitaxially growing a first collector layer on said second base layer;
    epitaxially growing a second collector layer which is substantially an electrode extraction layer on said first collector, and
    forming a collector electrode, at least one base electrode and at least one emitter electrode on said second collector layer at a portion in said cut portion, said first external base region and said first emitter layer, respectively.

5. The method according to claim 4, wherein $Al_xGa_{1-x}As$ (x>0), GaAs and $Al_yGa_{1-y}As$ (y≧0) are used for said second emitter layer, said second base layer and said semi-insulating layer, respectively, and wherein said cut portion is formed by wet etching.

6. The method according to claim 4, wherein said second base layer, said first collector layer and said second collector layer are grown by molecular beam epitaxy.

7. A method of manufacturing III-V compound heterojunction bipolar transistor comprising the step of:
    forming a first collector layer which is substantially an electrode extraction layer on a semi-insulating semiconductor substrate;
    forming a second collector layer on said first collector layer;
    forming a semi-insulating semiconductor layer on said second collector layer;
    removing at least a part of said semi-insulating semiconductor layer to form a cut portion with a slant wall so that said second collector layer is partly exposed at said cut portion;
    epitaxially growing a base layer on said semi-insulating semiconductor layer to be a first external base region, on said slant wall to be a second external base region, and on the exposed portion of a second collector layer to be a base region;

epitaxially growing a first emitter layer on said base layer, wherein the energy band gap of said first emitter layer is greater than the energy band gap of said base layer so that a heterojunction is formed by said first emitter layer and said base layer;

epitaxially growing a second emitter layer which is substantially an electrode extraction layer on said first emitter; and forming an emitter electrode, at least one base electrode and at least one collector electrode on said second emitter layer at a portion in said cut portion, said first external base region and said first collector layer, respectively.

8. The method according to claim 7, wherein $Al_xGa_{1-x}As$ ($x>0$), GaAs and $Al_yGa_{1-y}As$ ($y \geqq 0$) are used for said first emitter layer, said base layer and said semi-insulating layer, respectively, and wherein said cut portion is formed by wet etching.

9. The method according to claim 8, wherein said base layer, said first emitter layer and said second emitter layer are grown by molecular beam epitaxy.

10. A method of manufacturing a III-V compound heterojunction bipolar transistor comprising the steps of:

forming a first emitter layer which is substantially an electrode extraction layer on a semi-insulating semiconductor substrate;

forming a second emitter layer on said first emitter layer;

forming a semi-insulating semiconductor layer on said second emitter layer;

removing at least a part of said semi-insulating semiconductor layer to form a cut portion with a slant wall so that said second emitter layer is partly exposed at said cut portion;

epitaxially growing a base layer on said semi-insulating semiconductor layer to be a first external base region, on said slant wall to be a second external base region, and on the exposed portion of said second emitter layer to be a base region, wherein the energy band gap of said second emitter layer is greater than the energy band gap of said base layer so that a heterojunction is formed by said emitter layer and said base layer;

epitaxially growing a first collector layer on said base layer;

epitaxially growing a second collector layer which is substantially an electrode extraction layer on said first collector, and forming a collector electrode, at least one base electrode and at least one emitter electrode on said second collector layer at a portion in said cut portion, said first external base region and said first emitter layer, respectively.

11. The method according to claim 10, wherein $Al_xGa_{1-x}As$ ($x>0$), GaAs and $Al_yGa_{1-y}As$ ($y \geqq 0$) are used for second emitter layer, said base layer and said semi-insulating layer, respectively, and wherein said cut portion is formed by wet etching.

12. The method according to claim 10, wherein said base layer, said first collector layer and said second collector layer are grown by molecular beam epitaxy.

* * * * *